(12) United States Patent
Fiedler

(10) Patent No.: US 7,061,280 B2
(45) Date of Patent: Jun. 13, 2006

(54) SIGNAL DETECTION CIRCUIT

(76) Inventor: Alan Fiedler, 8777 Walton Oaks Dr., Bloomington, MN (US) 55438

( * ) Notice: Subject to any disclaimer, the term of this patent is extended or adjusted under 35 U.S.C. 154(b) by 133 days.

(21) Appl. No.: 10/775,309

(22) Filed: Feb. 10, 2004

(65) Prior Publication Data

US 2005/0174148 A1   Aug. 11, 2005

Related U.S. Application Data

(60) Provisional application No. 60/445,751, filed on Feb. 7, 2003.

(51) Int. Cl.
*H03K 5/22* (2006.01)

(52) U.S. Cl. .............................. 327/68; 327/72; 327/74
(58) Field of Classification Search .................. 327/56, 327/65–68, 72, 74, 75, 563; 330/258
See application file for complete search history.

(56) References Cited

U.S. PATENT DOCUMENTS 5,936,466 A * 8/1999 Andoh et al. ................ 330/253

* cited by examiner

*Primary Examiner*—Kenneth B. Wells
(74) *Attorney, Agent, or Firm*—Fulbright & Jaworski L.L.P.

(57) ABSTRACT

So as to compare an amplitude of a differential input signal to a threshold, a signal detection circuit includes first and second matched input signal level-shifters, a comparator threshold generation circuit, and a two-stage comparator. The differential input signal is comprised of a true input signal and a complement input signal, and the first input signal level-shifter is coupled to the true input signal, and the second input level-shifter is coupled to the complement input signal. The comparator threshold generation circuit is matched to the input signal level-shifters and outputs first and second compare voltages. The first stage of the two-stage comparator outputs a low signal if the more positive of the level-shifted input signals is greater than the more positive of the compare voltages. The second stage of the two-stage comparator amplifies the output of the first stage of the two-stage comparator, includes positive feedback to inhibit comparator self-oscillation, and has a sufficiently low bandwidth so as not to pass to its output a momentary pulse at its input during a transition in the differential input signal.

20 Claims, 6 Drawing Sheets

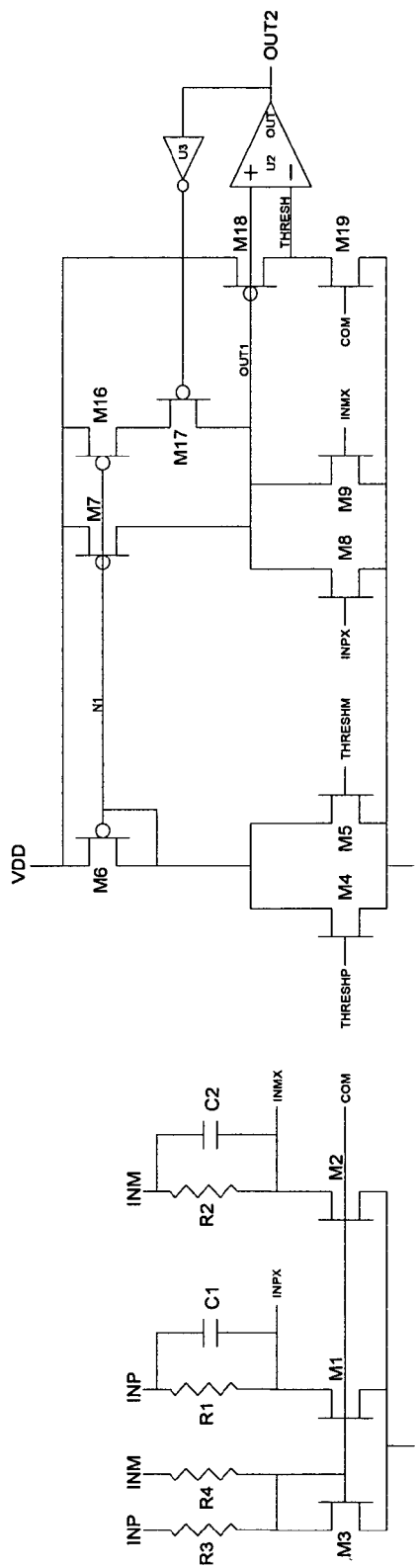
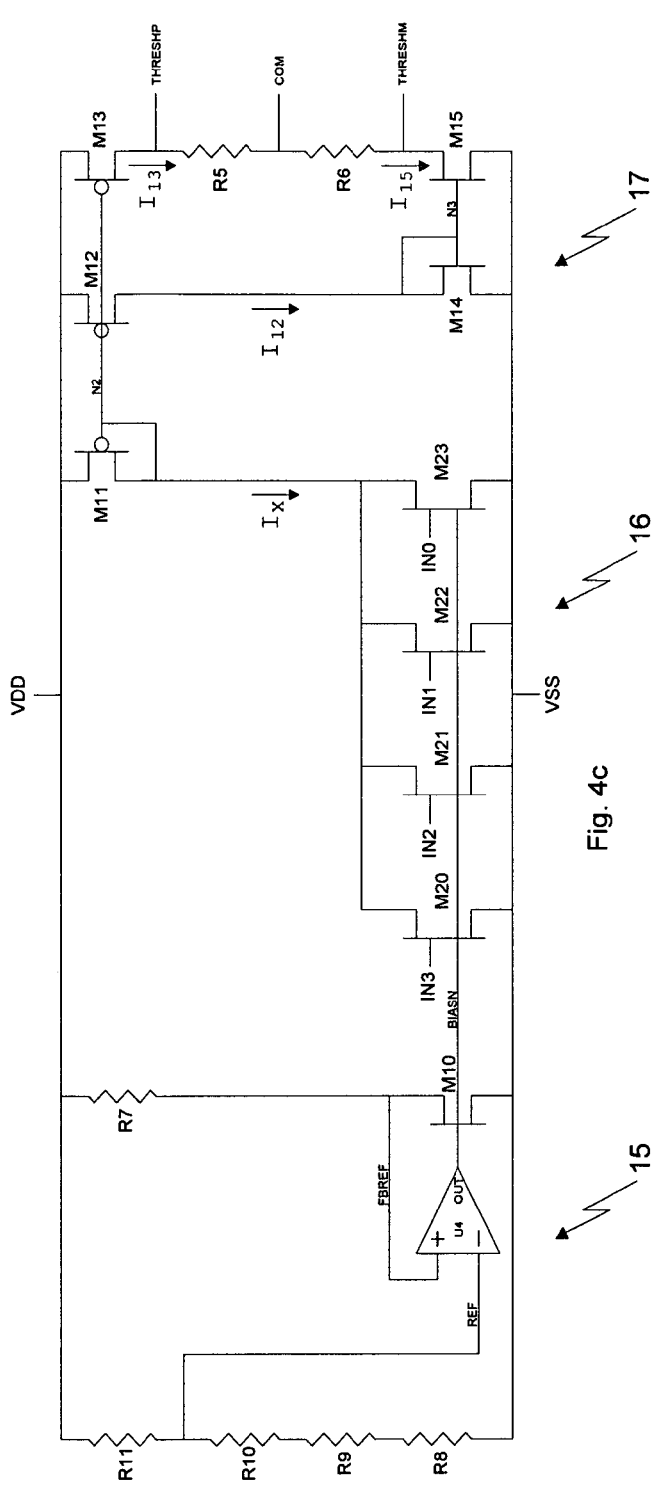
Fig. 4a
Fig. 4b
Fig. 4c

SIGNAL DETECTION CIRCUIT

RELATED APPLICATIONS

This application claims the benefit of priority pursuant to 35 USC §119(e) from U.S. provisional patent application Ser. No. 60/445,751, filed Feb. 7, 2003, and entirely incorporated herein by reference.

BACKGROUND OF THE INVENTION

This invention relates to semiconductor integrated circuits and, more particularly, to a signal detection circuit. The function of the signal detection circuit is to compare an amplitude of a differential input signal to a comparator threshold voltage and to produce an output signal which is either high or low depending on whether the signal's amplitude is less than or greater than the comparator threshold voltage. This invention is similar to a method of detecting an amplitude of a signal which uses a current-source-biased comparator, but replaces the current source with a short to a power supply terminal and adds input signal level-shifters, providing for a much-improved differential input signal common-mode range.

FIG. 1 is a schematic diagram illustrating a signal detection circuit of the prior art. A differential input signal comprises input signals INP and INM, with INP coupled to the gate terminal of M8, and INM coupled to the gate terminal of M9. A compare voltage THRESH, coupled to a gate terminal of M4, is set to a voltage equal to an average of INP and INM plus the comparator threshold voltage. The drain terminals of M8 and M9 are coupled together and to output terminal OUT1, and the source terminals of M4, M8, and M9 are coupled together and to current source I1. A current mirror comprising M6 and M7 has an input coupled to the drain of M4 and an output coupled to OUT1. N-type transistors M4, M8, and M9 are of equal size, and p-type transistors M6 and M7 are of equal size. When the amplitude of the differential input signal exceeds the comparator threshold voltage, input signal INP or INM is more positive than THRESH, and output terminal OUT1 will then be substantially low, indicating detection of the differential input signal. When the amplitude of the differential input signal is less than the comparator threshold voltage, input signal INP or INM is always more negative than THRESH, and output terminal OUT1 will then be substantially high. For most practical values of the compare voltage THRESH, during a transition of the differential input signal from one state to another (for example, from a "one" state to a "zero" state), OUT1 may tend to momentarily pulse from a low to a high voltage and then return to a low voltage when the transition is complete. In one embodiment, this pulse is inhibited with a capacitor coupled to OUT1.

SUMMARY OF THE INVENTION

To compare the amplitude of a differential input signal to a comparator threshold voltage, a signal detection circuit includes first and second matched input signal level-shifters, a compare voltage generation circuit, and a two-stage comparator. The differential input signal is comprised of a true input signal and a complement input signal, and the first input signal level-shifter is coupled to the true input signal, and the second input level-shifter is coupled to the complement input signal. The compare voltage generation circuit outputs a first compare voltage set to an average voltage of the output signals of the level-shifters plus the comparator threshold voltage, and a second compare voltage set to the average voltage of the output signals of the level-shifters minus the comparator threshold voltage. The first stage of the two-stage comparator outputs a low signal if the more positive of the level-shifted input signals is greater than the more positive of the compare voltages. The second stage of the two-stage comparator amplifies the output of the first stage of the two-stage comparator, includes positive feedback to inhibit comparator self-oscillation, and has a sufficiently low bandwidth so as not to pass to its output a momentary pulse at its input due to a transition in the differential input signal.

BRIEF DESCRIPTION OF THE DRAWINGS

FIG. 4 is a schematic diagram of the signal detection circuit with additional components, in accordance with the present invention.

DETAILED DESCRIPTION OF THE PREFERRED EMBODIMENTS

Figure 1:
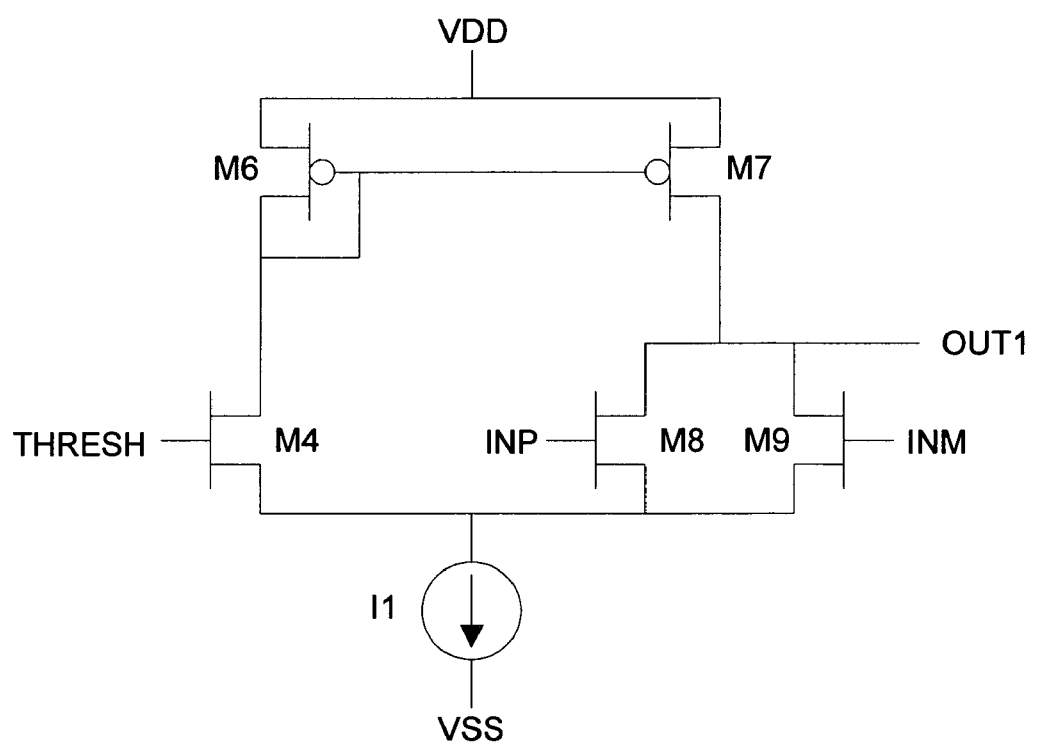
FIG. 1 is a schematic diagram of a prior-art signal detection circuit.
Figure 2A:
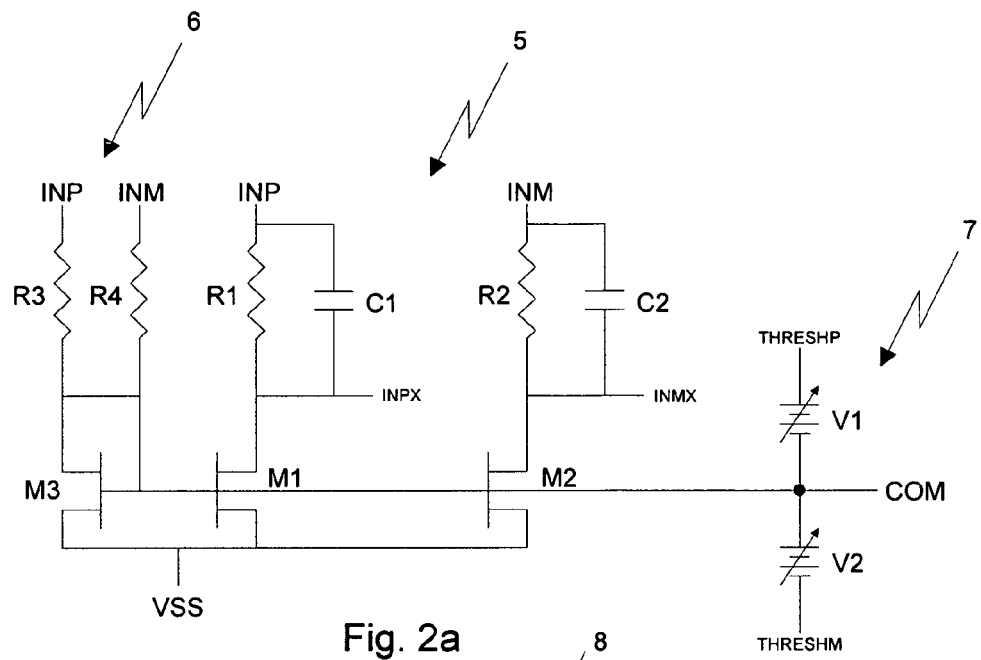
FIG. 2 is a schematic diagram of components of a signal detection circuit in accordance with one embodiment of the present invention.
Figure 2B:
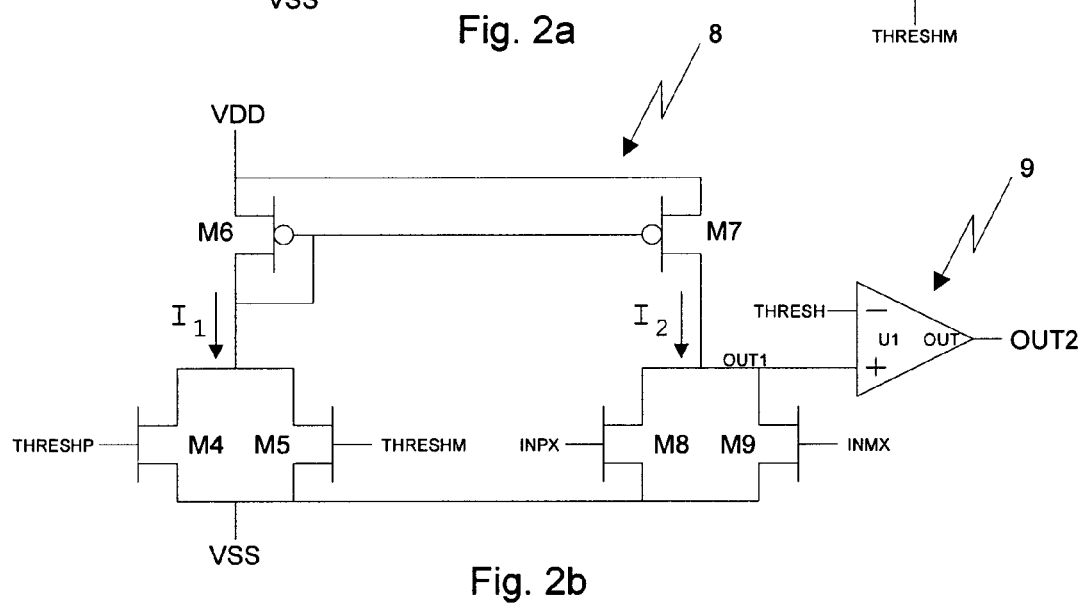

The signal detection circuits of FIG. 2 illustrate components of one embodiment of the invention. FIG. 2a shows input signal level-shifters 5 and a matched circuit 6 which sets the voltage of a common signal to that of the average voltage of the input signal level-shifter output signals. Also included are level-shifting voltage sources 7 referenced to the common signal which assist in setting the compare voltages for the two-stage comparator illustrated in FIG. 2b.

The differential input signal is comprised of input signals INP and INM, which are coupled to the matched input signal level-shifters. Input signal INP is coupled to level-shifted signal INPX through series components R1 and C1. A level-shift current from transistor M1 induces a voltage drop across R1, and capacitor C1 provides a low-impedance signal path to couple INP to INPX with minimal high-frequency signal loss. Similarly, input signal INM is coupled to level-shifted signal INMX through series components R2 and C2, and a level-shift current from transistor M2 sets a voltage drop across R2, and capacitor C2 provides a low-impedance signal path to couple INM to INMX with minimal high-frequency signal loss. These two level-shifters are matched: R1 and R2 are the same size and resistance value, C1 and C2 are the same size and capacitance value, and M1 and M2 are the same size and have matched K-factors (voltage-to-current conversion gain).

The matched circuit sets the voltage of the common signal COM to that of the average voltage of INPX and INMX, and comprises resistors R3 and R4, and transistor M3. In a preferred embodiment, resistors R1, R2, R3, and R4 are the same size and value, the gate width of M3 is twice the gate width of M1 and M2 (or, alternatively, M3 comprises two transistors matched to M1 and M2), and the gate lengths of M1, M2, and M3 are equal. Two final components of the circuit of FIG. 2a are level-shifting voltage sources V1 and V2. In a preferred embodiment, V1 and V2 are each set to a voltage equal to the comparator threshold voltage.

FIG. 2b depicts the two-stage comparator, comprising a first comparator 8 and a second comparator 9. A first dual-input voltage-to-current converter comprised of transistors M4 and M5 has an output and its inputs are coupled to compare voltages THRESHP and THRESHM. A second dual-input voltage-to-current converter comprised of transistors M8 and M9 has an output coupled to OUT1, and its inputs are coupled to level-shifted signals INPX and INMX. A current mirror comprised of transistors M6 and M7 has an input coupled to the output of the first dual-input voltage-to-current converter and an output coupled to OUT1 and to an input of the second comparator. Coupled to a second input of the second comparator is a threshold voltage THRESH.

Figure 3A:
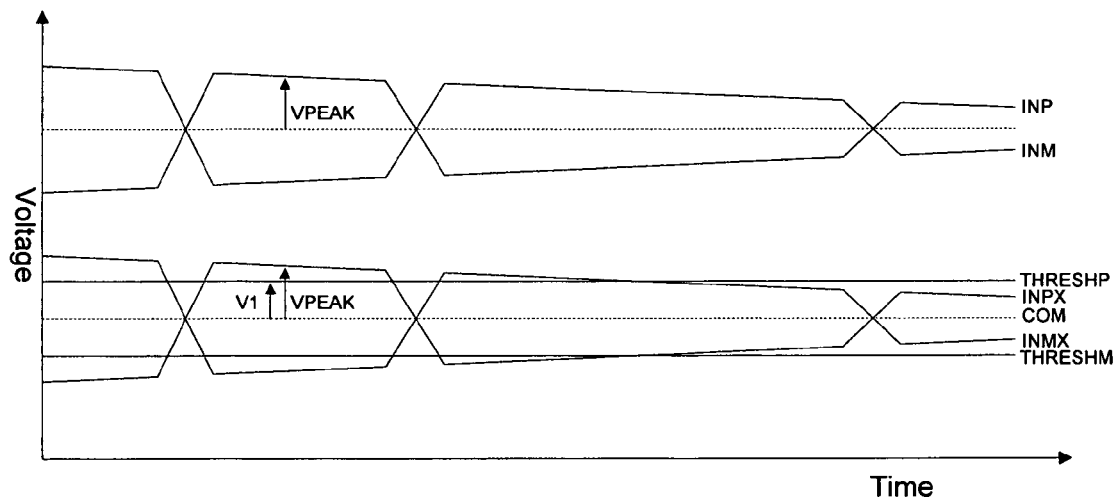
FIG. 3 is a waveform diagram illustrating operation of the signal detection circuit of FIG. 2.
Figure 3B:
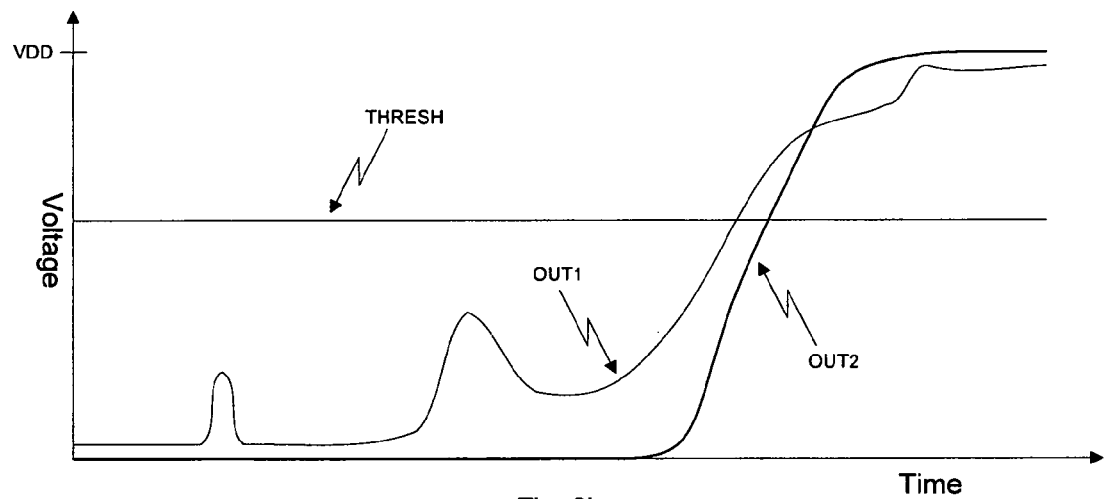

FIG. 3 illustrates the functionality of the circuits of FIG. 2. Waveforms labeled INP, INM, THRESHP, THRESHM, INPX, INMX, COM, THRESH, OUT1, and OUT2 depict signals at nodes of FIG. 2 having the same designations. In this illustration, the amplitude of differential signal INP-INM diminishes over time until below a threshold, at which time OUT1 and OUT2 each transition from a low level to a high level. The first comparator takes advantage of a square-law dependence of voltage-to-current conversion gain of transistors M4, M5, M8, and M9.

Consider currents I1 and I2 of FIG. 2 flowing through transistors M4 and M5, and transistors M8 and M9, respectively, given by the equations $$I1 = K_{M4}(V_{GS,M4} - V_{T,M4})^2 + K_{M5}(V_{GS,M5} - V_{T,M5})^2 \quad (1)$$

$$I2 = K_{M8}(V_{GS,M8} - V_{T,M8})^2 + K_{M9}(V_{GS,M9} - V_{T,M9})^2 \quad (2)$$

Each of the constants $K_{Mn}$ and $V_{T,Mn}$ (n=4,5,8,9) represent a transistor's K-factor (voltage-to-current conversion gain) and threshold voltage, respectively. In a preferred embodiment, and for the purposes of simplifying the following analysis, the gate length of all transistors of FIG. 2 are equal, the gate widths of M1 and M2 are equal, the gate width of M3 is twice that of M1 and M2 (or, alternatively, M3 comprises first and second transistors matched to M1 and M2, respectively), the gate widths of M4, M5, M8, and M9 are equal, and the gate widths of M6 and M7 are equal. Additionally, resistors R1, R2, R3, and R4 are equal in resistance value. It is further assumed that all the transistor K-factors are equal and are equal to K and that all the transistor threshold voltages are equal and are equal to $V_T$. With a current gain of the current mirror substantially equal to one because M6 and M7 are of equal size, the voltage of OUT1 will be substantially near VDD when I1>I2 and near VSS when I1<I2. With voltage sources V1 and V2 set to comparator threshold voltage $V_1$, the following relations are evident from FIG. 2:

$$V_{GS,M4} = V_{THRESHP} - V_{VSS} \quad (3)$$

$$V_{GS,M5} = V_{THRESHM} - V_{VSS} \quad (4)$$

$$V_{GS,M8} = V_{INPX} - V_{VSS} \quad (5)$$

$$V_{GS,M9} = V_{INMX} - V_{VSS} \quad (6)$$

$$V_{THRESHP} = V_{COM} + V_1 \quad (7)$$

$$V_{THRESHM} = V_{COM} - V_1 \quad (8)$$

Defining $V_{PEAK}$ as a peak voltage of signals INP and INM above average voltage $(V_{INP} + V_{INM})/2$, and with a voltage drop across each of level-shifting resistors R1–R4 being substantially equal, the following relations are true:

$$V_{INPX} = V_{COM} + V_{PEAK} \quad (9)$$

$$V_{INMX} = V_{COM} - V_{PEAK} \quad (10)$$

Combining equations (1) through (10) gives the following result:

$$I2 - I1 = 2K(V_{PEAK}^2 - V_1^2) \quad (11)$$

The signal detection circuit is operating at a threshold when I1=I2. When I1>I2, a net positive current will charge OUT1 to a voltage substantially near VDD, and when I1<I2, a net negative current will discharge OUT1 to a voltage substantially near VSS. A condition for which the first comparator is at its threshold is given by that voltage of $V_{PEAK}$ for which I2−I1=0, and is obtained by inspection as $V_{PEAK} = V_1$, thereby confirming the proper definition of $V_1$ as the comparator threshold voltage.

Finally, it is instructive to differentiate equation (11):

$$\partial(I2 - I1)/\partial V_{PEAK} = 4KV_1 \quad (12)$$

The quantity $4KV_1$ is a measure of the first comparator's voltage-to-current gain, and this gain is a non-zero quantity if $V_1 \neq 0$. In all practical applications of this signal detection circuit, this is indeed the case.

FIG. 4 illustrates a detailed schematic of the complete signal detection circuit.

FIG. 4a illustrates the circuit of FIG. 2a, but with voltage sources V1 and V2 removed.

FIG. 4b illustrates the circuit of FIG. 2b, but includes transistors M18 and M19 used to set threshold voltage THRESH, and also includes transistors M16 and M17 and inverter U3 so as to provide positive feedback to the operation of the second comparator. This last addition inhibits comparator self-oscillation when operating near threshold for an extended period of time.

FIG. 4c illustrates a circuit which implements the functionality of voltage sources V1 and V2 of FIG. 2a, and comprises bias generator 15, switched current-source 16, and current-to-voltage converter 17. Bias generator 15 consists of a resistor string made from R8–R11, used to generate reference voltage REF, and a feedback circuit consisting of differential-to-single-ended amplifier U4, transistor M10, and reference resistor R7. Negative feedback forces feedback reference node voltage $V_{FBREF}$ to be substantially equal to $V_{REF}$. It then follows that current through M10 and R7 is given by $$I_{M10} = I_{R7} = (V_{VDD} - V_{REF})/R_{R7} \quad (13)$$

Switched current-source 16 is a binary-weighted switched current source and is comprised of dual-gate transistors M20, M21, M22, and M23. In a preferred embodiment, these dual-gate transistors each consist of two series transistors having a gate width and an equal gate length. The gate width of the transistors of dual-gate transistor M22 is twice that of the transistors of dual-gate transistor M23; the gate width of the transistors of dual-gate transistor M21 is twice that of the transistors of dual-gate transistor M22; and the gate width of the transistors of dual-gate transistor M20 is twice that of the transistors of dual-gate transistor M21. Additionally, the gate width of transistor M10 is twice the gate width of the transistors of dual-gate transistor M20. In combination, bias generator 15 and switched current-source 16 form a binary-weighted, programmable current source controlled by logic terminals IN0, IN1, IN2, and IN3 and having an output current given by $$I_X = (IN/16) * I_{M10} \quad (14)$$

where IN is a decimal number between 0 and 15 and is set by logic levels IN[3:0].

Current-to-voltage converter 17 comprises three current mirrors each with a gain substantially equal to 1, and resistors R5 and R6. A first current mirror comprising M11 and M12 generates output current $I_{12}$ equal to input current $I_X$; a second current mirror comprising M11 and M13 generates output current $I_{13}$ equal to input current $I_X$; and a third current mirror comprising M14 and M15 generates output current $I_{15}$ equal to input current $I_{12}$. It then follows that compare voltages $V_{THRESHP}$ and $V_{THRESHM}$ are given by $$V_{THRESHP} = V_{COM} + I_X * R_{R5} \quad (15)$$

$$V_{THRESHM} = V_{COM} - I_X * R_{R6} \quad (16)$$

In a preferred embodiment, all resistors of FIG. 4c are of equal value, and equations (13)–(16) can then be combined and simplified to obtain $$V_{THRESHP} = V_{COM} + V_1 \quad (17)$$

$$V_{THRESHM} = V_{COM} - V_1 \quad (18)$$

where $V_1 = (V_{VDD}/4) * (IN/16)$ \quad (19)

This final equation (19) illustrates the influence of logic terminals IN[3:0] on the comparator threshold voltage, $V_1$.

Figure 5:
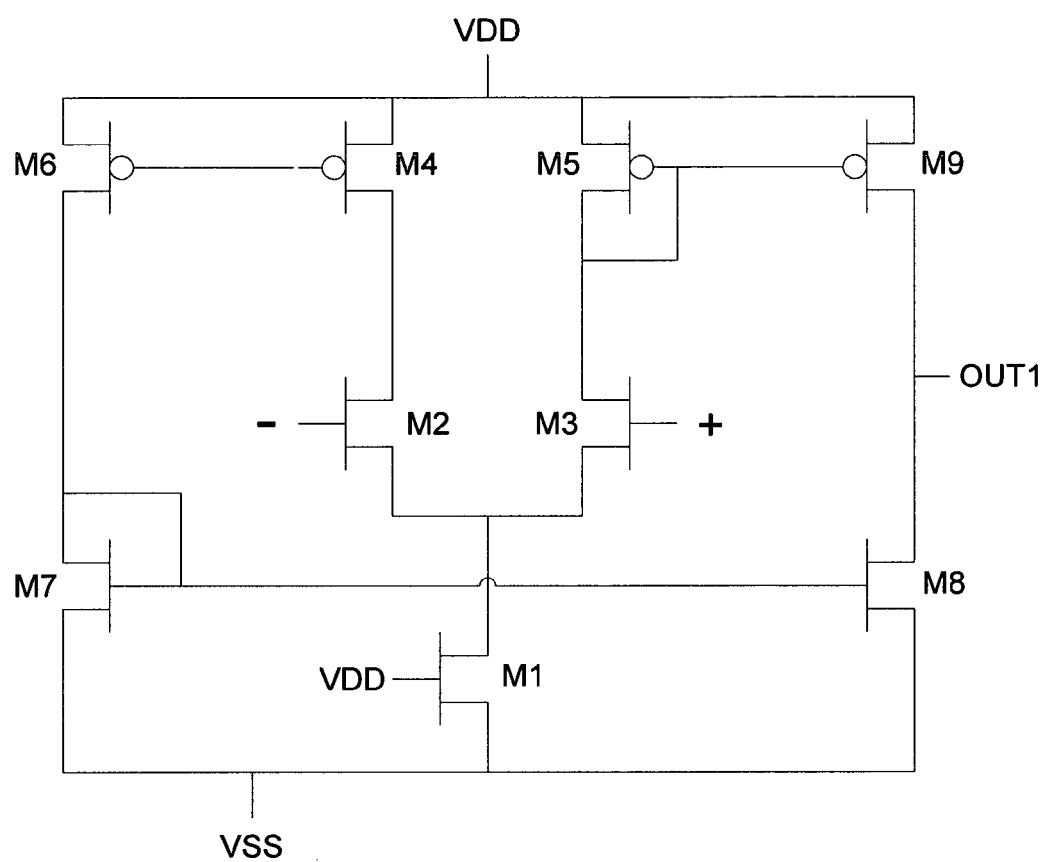
FIG. 5 is a schematic diagram of a differential to single-ended amplifier, in accordance with the present invention.

FIG. 5 illustrates the differential to single-ended amplifier, instantiated as U1 in FIG. 2b, as U2 in FIG. 4b, and as U4 in FIG. 4c, and is comprised of transistors M1–M9. Transistor M1 is a resistive current source which biases differential transistor pair M2 and M3. The drain of M2 is coupled to output OUT through two series current mirrors comprising p-type transistors M4 and M6, and n-type transistors M7 and M8. The drain of M3 is coupled to OUT through a single current mirror comprising p-type transistors M5 and M9. In a preferred embodiment, the gate lengths of all transistors but M1 are the same, the gate width of n-type transistors M2, M3, M7, and M8 are the same, and the gate width of p-type transistors M4, M5, M6, and M9 are the same. Additionally, the gate width of n-type transistor M1 is equal to the gate width of the other n-type transistors, and the gate length of M1 is at least 5 times longer than the gate length of the other n-type transistors. In U2, so as to prevent false switching at its output when the differential input signals transition from low to high or from high to low, the gate length of M1 is increased to 10 times (or more) that of the gate length of the other n-type transistors, for the purpose of decreasing the bandwidth and switching speed of U2.

Figure 6:
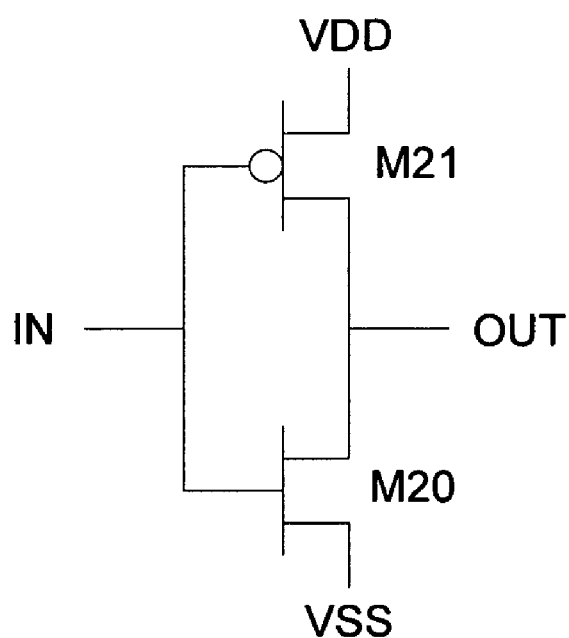
FIG. 6 is a schematic diagram of a logic inverter, in accordance with the present invention.

FIG. 6 illustrates logic inverter U3 of FIG. 4b, used to facilitate positive feedback to inhibit comparator self-oscillation. The logic inverter comprises n-type transistor M20 and p-type transistor M21. The gate of each transistor is coupled to input IN, and the drain of each transistor is coupled to output OUT.

The signal detection circuit can be implemented with discreet components, with semiconductor devices embedded in an integrated circuit such as an application specific integrated circuit (ASIC), or with a combination of both. Individual signals or devices can be active high or low, and corresponding circuitry can be converted or complemented to suit any particular convention. The term "coupled" used in the claims includes various types of connections or couplings and includes a direct connection or a connection through one or more intermediate components. Except to the extent specified in the following claims, circuit configurations and device sizes shown herein are provided as examples only. Those skilled in the art will recognize that desired and proper circuit operation can be achieved with other circuit configurations, device sizes, and/or combinations of device sizes.

What is claimed is:

1. A signal detection circuit, comprising:
   first and second power supply terminals;
   first and second input terminals;
   a first output terminal;
   a first resistor coupled between the first input terminal and a first level-shifted input signal node;
   a first transistor having a drain coupled to the first level-shifted input signal node, a gate coupled to a common node, and a source coupled to the first power supply terminal;
   a second resistor coupled between the second input terminal and a second level-shifted input signal node;
   a second transistor having a drain coupled to the second level-shifted input signal node, a gate coupled to the common node, and a source coupled to the first power supply terminal;
   a third resistor coupled between the first input terminal and the common node;
   a fourth resistor coupled between the second input terminal and the common node;
   a third transistor having a gate and a drain coupled to the common node and a source coupled to the first power supply terminal;
   a first voltage source coupled between the common node and a first threshold node;
   a second voltage source coupled between the common node and a second threshold node; and
   a first comparator comprising:
   a fourth transistor having a drain coupled to a first node, a gate coupled to the first threshold node, and a source coupled to the first power supply terminal;
   a fifth transistor having a drain coupled to the first node, a gate coupled to the second threshold node, and a source coupled to the first power supply terminal;
   a sixth transistor having a gate and a drain coupled to the first node, and a source coupled to the second power supply terminal;
   a seventh transistor having a drain coupled to the first output terminal, a gate coupled to the first node, and a source coupled to the second power supply terminal;
   an eighth transistor having a drain coupled to the first output terminal, a gate coupled to the first level-shifted input signal node, and a source coupled to the first power supply terminal; and
   a ninth transistor having a drain coupled to the first output terminal, a gate coupled to the second level-shifted input signal node, and a source coupled to the first power supply terminal.

2. The signal detection circuit of claim 1, further comprising:
   a first capacitor coupled between the first input terminal and the first level-shifted input signal node; and
   a second capacitor coupled between the second input terminal and the second level-shifted input signal node.

3. The signal detection circuit of claim 2, wherein:
   the first voltage source comprises a first programmable current source coupled to the first threshold node, and a fifth resistor coupled between the common node and the first threshold node; and
   the second voltage source comprises a second programmable current source coupled to the second threshold node, and a sixth resistor coupled between the common node and the second threshold node.

4. The signal detection circuit of claim 3, wherein the first and second programmable current sources comprise:

a differential to single-ended amplifier having an inverting input terminal coupled to a reference voltage terminal, a non-inverting input terminal coupled to a feedback node, and an output terminal coupled to a bias node;

a tenth transistor having a drain coupled to the feedback node, a gate coupled to the bias node, and a source coupled to the first power supply terminal;

a seventh resistor coupled between the feedback node and the second power supply terminal;

a first dual-gate transistor having a drain coupled to a second node, a first gate coupled to the bias node, a second gate coupled to a first logic terminal, and a source coupled to the first power supply terminal;

a second dual-gate transistor having a drain coupled to the second node, a first gate coupled to the bias node, a second gate coupled to a second logic terminal, and a source coupled to the first power supply terminal;

a third dual-gate transistor having a drain coupled to the second node, a first gate coupled to the bias node, a second gate coupled to a third logic terminal, and a source coupled to the first power supply terminal;

a fourth dual-gate transistor having a drain coupled to the second node, a first gate coupled to the bias node, a second gate coupled to a fourth logic terminal, and a source coupled to the first power supply terminal;

an eleventh transistor having a gate and a drain coupled to the second node, and a source coupled to the second power supply terminal;

a twelfth transistor having a drain, a gate coupled to the second node, and a source coupled to the second power supply terminal;

a thirteenth transistor having a drain coupled to the first threshold node, a gate coupled to the second node, and a source coupled to the second power supply terminal;

a fourteenth transistor having a gate and a drain coupled to the drain of the twelfth transistor, and a source coupled to the first power supply terminal; and a fifteenth transistor having a drain coupled to the second threshold node, a gate coupled to the gate of the fourteenth transistor, and a source coupled to the first power supply terminal.

5. The signal detection circuit of claim 4, wherein the first, second, third, and fourth dual-gate transistors each further comprise:

a first transistor having a drain, a gate coupled to the first gate, and a source coupled to the first power supply terminal; and a second transistor having a drain coupled to the second node, a gate coupled to the second gate, and a source coupled to the drain of the first transistor.

6. The signal detection circuit of claim 2, further comprising a second comparator having an inverting input terminal coupled to a threshold terminal, a non-inverting input terminal coupled to the first output terminal, and an output terminal coupled to a second output terminal.

7. The signal detection circuit of claim 6, wherein the second comparator further comprises:

a sixteenth transistor having a drain, a gate coupled to the first node, and a source coupled to the second power supply terminal;

a seventeenth transistor having a gate, a drain coupled to the first output terminal, and a source coupled to the drain of the sixteenth transistor;

an eighteenth transistor having a drain coupled to the threshold terminal, a gate coupled to the first output terminal, and a source coupled to the second power supply terminal;

a nineteenth transistor having a drain coupled to the threshold terminal, a gate coupled to the common node, and a source coupled to the first power supply terminal;

a differential to single-ended amplifier having a non-inverting input terminal coupled to the first output terminal, an inverting input terminal coupled to the threshold terminal, and an output terminal coupled to the second output terminal;

a logic inverter having an input terminal coupled to the second output terminal and an output terminal coupled to the gate of the seventeenth transistor.

8. The signal detection circuit of claim 4, wherein the differential to single-ended amplifier further comprises:

a first transistor having a drain, a source coupled to the first power supply terminal, and a gate coupled to the second power supply terminal;

a second transistor having a drain, a source coupled to the drain of the first transistor, and a gate coupled to the differential to single-ended amplifier inverting input terminal;

a third transistor having a drain, a source coupled to the drain of the first transistor, and a gate coupled to the differential to single-ended amplifier non-inverting input terminal;

a fourth transistor having a gate and a drain coupled to the drain of the second transistor, and a source coupled to the second power supply terminal;

a fifth transistor having a gate and a drain coupled to the drain of the third transistor, and a source coupled to the second power supply terminal;

a sixth transistor having a drain, a gate coupled to the gate of the fourth transistor, and a source coupled to the second power supply terminal;

a seventh transistor having a gate and a drain coupled to the drain of the sixth transistor, and a source coupled to the first power supply terminal;

an eighth transistor having a drain coupled to the differential to single-ended amplifier output terminal, a source coupled to the first power supply terminal, and a gate coupled to gate of the seventh transistor; and a ninth transistor having a drain coupled to the differential to single-ended amplifier output terminal, a source coupled to the second power supply terminal, and a gate coupled to the gate of the fifth transistor.

9. The signal detection circuit of claim 7, wherein the logic inverter further comprises:

a first transistor having a drain coupled to the gate of the seventeenth transistor, a gate coupled to the second output terminal, and a source coupled to the first power supply terminal; and a second transistor having a drain coupled to the gate of the seventeenth transistor, a gate coupled to the second output terminal, and a source coupled to the second power supply terminal.

10. The signal detection circuit of claim 7, wherein the first and second input terminals are coupled to a differential input signal.

11. The signal detection circuit of claim 10, wherein device sizes and a capacitive load of the first output terminal are selected such that a frequency response of said signal detection circuit is sufficiently slow that a change in polarity or transition of the differential input signal will not cause the signal at the second output terminal to change state.

12. The signal detection circuit of claim 11, wherein the differential input signal has a differential amplitude.

13. The signal detection circuit of claim 12, wherein the second output terminal will exhibit:
- a high logic level when the differential input signal amplitude is less than a first comparator threshold voltage; and
- a low logic level when the differential input signal amplitude is greater than a second comparator threshold voltage.

14. The signal detection circuit of claim 13, wherein the first comparator threshold voltage is less than the second comparator threshold voltage.

15. The signal detection circuit of claim 14, wherein the first and second thresholds are set in part by logic levels applied to the first, second, third, and fourth logic terminals.

16. A signal detection circuit for comparing an amplitude of a differential input signal to a threshold, said differential input signal including a true input signal and a complement input signal, said signal detection circuit comprising:
- first and second matched input signal level-shifters;
- a comparator threshold generation circuit; and
- a two-stage comparator, wherein the first input signal level-shifter is coupled to the true input signal, and the second input level-shifter is coupled to the complement input signal, wherein the comparator threshold generation circuit is matched to the first and second matched input signal level-shifters and outputs first and second compare voltages, wherein a first stage of the two-stage comparator outputs a low signal if the more positive of the first and second level-shifted input signals is greater than the more positive of the first and second compare voltages, and wherein the second stage of the two-stage comparator amplifies the output of the first stage of the two-stage comparator.

17. The signal detection circuit of claim 16 wherein positive feedback is provided to inhibit comparator self-oscillation.

18. The signal detection circuit of claim 16 having a low bandwidth so as not output a momentary pulse presented at the differential input signal during a transition in the differential input signal.

19. A signal detection circuit which compares the amplitude of a differential input signal to a comparator threshold voltage, said signal detection circuit comprising:
- a first and second matched input signal level-shifters, each having an output signal;
- a compare voltage generation circuit; and
- a two-stage comparator, wherein the differential input signal is comprised of a true input signal and a complement input signal, wherein the first input signal level-shifter is coupled to the true input signal and the second input level-shifter is coupled to the complement input signal, wherein the compare voltage generation circuit outputs a first compare voltage set to an average voltage of the output signals of the first and second matched level-shifters plus the comparator threshold voltage and a second compare voltage set to the average voltage of the output signals of the first and second matched level-shifters minus the comparator threshold voltage, wherein the first stage of the two-stage comparator outputs a low signal if the more positive of the first and second matched level-shifted input signals is greater than the more positive of the first and second compare voltages, and wherein the second stage of the two-stage comparator amplifies the output of the first stage of the two-stage comparator.

20. The signal detection circuit of claim 19 having positive feedback to inhibit comparator self-oscillation and a sufficiently low bandwidth so as not to pass to an output of the two stage comparator a momentary pulse presented at the differential input signal.

* * * * *